US010860750B2

(12) United States Patent
Wang et al.

(10) Patent No.: US 10,860,750 B2
(45) Date of Patent: Dec. 8, 2020

(54) MODEL DRIVEN LAYOUT DESIGN FOR ROBOTICS WAREHOUSE

(71) Applicant: SAP SE, Walldorf (DE)

(72) Inventors: YongHui Wang, Shanghai (CN); YingJie Han, Shanghai (CN); XuTan Zhao, Shanghai (CN); ZhengXiang Zhang, Shanghai (CN)

(73) Assignee: SAP SE, Walldorf (DE)

(*) Notice: Subject to any disclaimer, the term of this patent is extended or adjusted under 35 U.S.C. 154(b) by 331 days.

(21) Appl. No.: 15/624,317

(22) Filed: Jun. 15, 2017

(65) Prior Publication Data

US 2018/0365347 A1 Dec. 20, 2018

(51) Int. Cl.
*G06F 30/13* (2020.01)

(52) U.S. Cl.
CPC .................... *G06F 30/13* (2020.01)

(58) Field of Classification Search
CPC .................................................. G06F 17/5004
USPC ............................................................ 703/1
See application file for complete search history.

(56) References Cited

U.S. PATENT DOCUMENTS

| | | | | |
|---|---|---|---|---|
| 7,251,612 | B1 * | 7/2007 | Parker | G06Q 10/06312 705/7.22 |
| 7,721,212 | B2 * | 5/2010 | Alfandary | G06Q 10/087 715/735 |
| 7,912,574 | B2 * | 3/2011 | Wurman | G05B 19/4189 700/213 |
| 7,920,962 | B2 * | 4/2011 | D'Andrea | G05B 19/41895 700/245 |
| 8,220,710 | B2 * | 7/2012 | Hoffman | G06Q 10/087 235/375 |
| 8,538,692 | B2 * | 9/2013 | Wurman | G06Q 50/30 701/532 |

(Continued)

OTHER PUBLICATIONS

Kim et al. (A Hybrid Scheduling and Control System Architecture for Warehouse Management, 2003, IEEE, pp. 991-1001) (Year: 2003).*

(Continued)

*Primary Examiner* — Iftekhar A Khan
(74) *Attorney, Agent, or Firm* — Fountainhead Law Group P.C.

(57) ABSTRACT

Embodiments relate to the design of a (good-to-person) robotics warehouse, and in particular to a warehouse layout model. The warehouse layout model is interposed between a warehouse map/location model containing concrete physical location data (e.g., QR codes), and an overlying warehouse management system generally configured to interact with a robotics system. The warehouse layout model defines basic elements such as •rackspace, •rackspace block, •lane, and •workstation. Those elements may in turn be arranged into basic patterns such as •storage area, •workstation area, •entry area, and others. The layout model also includes a set of basic traveling rules governing the movement of robots in relation to the elements and patterns. The layout model serves as a translator between the generalized warehouse management system, and the location/map model specific to a particular warehouse footprint. The warehouse layout model facilitates adapting the robotic system to changes as the warehouse expands and evolves.

16 Claims, 6 Drawing Sheets

(56) References Cited

U.S. PATENT DOCUMENTS

| | | | | |
|---|---|---|---|---|
| 8,649,899 | B2* | 2/2014 | Wurman | B65G 1/137 235/385 |
| 9,637,310 | B1* | 5/2017 | Zou | G05D 1/0297 |
| 9,827,683 | B1* | 11/2017 | Hance | G05B 19/4189 |
| 2010/0218131 | A1* | 8/2010 | Holm-Petersen | G06Q 10/087 715/771 |
| 2010/0316468 | A1* | 12/2010 | Lert | B65G 1/10 414/273 |
| 2012/0296611 | A1* | 11/2012 | Teller | G06F 30/13 703/1 |
| 2014/0135976 | A1* | 5/2014 | Gue | B65G 1/1378 700/214 |
| 2014/0257555 | A1* | 9/2014 | Bastian, II | G06F 17/00 700/230 |
| 2014/0361077 | A1* | 12/2014 | Davidson | G06Q 50/28 235/385 |
| 2015/0117995 | A1* | 4/2015 | D'Andrea | B66F 9/075 414/467 |
| 2016/0236867 | A1* | 8/2016 | Brazeau | B65G 1/1378 |
| 2016/0271800 | A1* | 9/2016 | Stubbs | B25J 9/1666 |
| 2016/0274586 | A1* | 9/2016 | Stubbs | G06K 19/07762 |
| 2016/0355337 | A1* | 12/2016 | Lert | B65G 1/0478 |
| 2017/0091349 | A1* | 3/2017 | R M | G06F 30/13 |
| 2017/0158430 | A1* | 6/2017 | Raizer | B65G 1/137 |
| 2017/0313514 | A1* | 11/2017 | Lert, Jr. | B65G 1/1378 |
| 2018/0025460 | A1* | 1/2018 | Watanabe | G06Q 10/063112 705/28 |
| 2018/0029797 | A1* | 2/2018 | Hance | B25J 19/023 |
| 2018/0060764 | A1* | 3/2018 | Hance | G06Q 10/06315 |
| 2018/0060765 | A1* | 3/2018 | Hance | B65G 57/02 |
| 2018/0068255 | A1* | 3/2018 | Hance | G06Q 10/087 |
| 2018/0071032 | A1* | 3/2018 | de Almeida Barreto | A61B 34/20 |
| 2018/0075402 | A1* | 3/2018 | Stadie | G06Q 10/087 |
| 2018/0084242 | A1* | 3/2018 | Rublee | G06T 19/003 |
| 2018/0088586 | A1* | 3/2018 | Hance | G06Q 10/0832 |
| 2018/0108102 | A1* | 4/2018 | Kapuria | B65G 1/0492 |
| 2018/0158016 | A1* | 6/2018 | Pandya | G05B 19/41895 |
| 2018/0180421 | A1* | 6/2018 | Holz | G05D 1/0221 |
| 2018/0182054 | A1* | 6/2018 | Yao | G06Q 30/0635 |
| 2018/0225795 | A1* | 8/2018 | Napoli | G06Q 10/06316 |
| 2018/0251300 | A1* | 9/2018 | Kapuria | B25J 9/1664 |
| 2018/0306587 | A1* | 10/2018 | Holz | G06T 7/344 |
| 2018/0306589 | A1* | 10/2018 | Holz | G01C 21/28 |
| 2018/0306591 | A1* | 10/2018 | Jose | G06Q 10/08 |
| 2018/0364719 | A1* | 12/2018 | Wang | G06F 16/22 |

OTHER PUBLICATIONS

Amato et al. (An approach to control automated warehouse systems, Control Engineering Practice 13 (2005) 1223-1241) (Year: 2005).*

Tan et al. ("Sustainable Warehouse Management Modelling", NACCQ 2008, pp. 109-115) (Year: 2008).*

Lamballais et al. ("Estimating performance in a Robotic Mobile Fulfillment System", European Journal of Operational Research 256 (2017) 976-990) (Year: 2017).*

* cited by examiner

MODEL DRIVEN LAYOUT DESIGN FOR ROBOTICS WAREHOUSE

BACKGROUND

Unless otherwise indicated herein, the approaches described in this section are not prior art to the claims in this application and are not admitted to be prior art by inclusion in this section.

Warehouse storage systems have evolved to "good-to-person" schemes, in which robots move product racks to/from a human stock handler's stationary workspace. Such environments may feature a warehouse management system (WMS) that is responsible for coordinating activity of the mobile robots within the physical warehouse space.

Current WMS' may be custom designed for a specific warehouse physical layout. Thus the stock placement strategy and warehouse process flow may be specifically tailored to that particular layout. Such lack of flexibility can lead to complexity and expense in updating the WMS when the warehouse layout is to be changed (e.g., expanded). And, owing to the implicit relationship between physical layout and the WMS, the underlying location and layout of the robotics warehouse may not actually be explicitly visible to the WMS.

SUMMARY

Embodiments relate to the design of a (good-to-person) robotics warehouse, and in particular to a warehouse layout model. The warehouse layout model is interposed between a warehouse map/location model containing concrete physical location data (e.g., QR codes), and an overlying warehouse management system generally configured to interact with a robotics system. The warehouse layout model defines basic elements such as •rackspace, •rackspace block, •lane, and •workstation. Those elements may in turn be arranged into basic patterns such as •storage area, •workstation area, •entry area, and others. The layout model also includes a set of basic traveling rules governing the movement of robots in relation to the elements and patterns. The layout model serves as a translator between the generalized warehouse management system, and the location/map model specific to a particular warehouse footprint. The warehouse layout model facilitates adapting the robotic system and warehouse management system to changes as the warehouse expands.

The following detailed description and accompanying drawings provide a better understanding of the nature and advantages of embodiments.

DETAILED DESCRIPTION

Described herein are methods and apparatuses implementing a layout design for a robotics warehouse. In the following description, for purposes of explanation, numerous examples and specific details are set forth in order to provide a thorough understanding of embodiments according to the present invention. It will be evident, however, to one skilled in the art that embodiments as defined by the claims may include some or all of the features in these examples alone or in combination with other features described below, and may further include modifications and equivalents of the features and concepts described herein.

Figure 1:
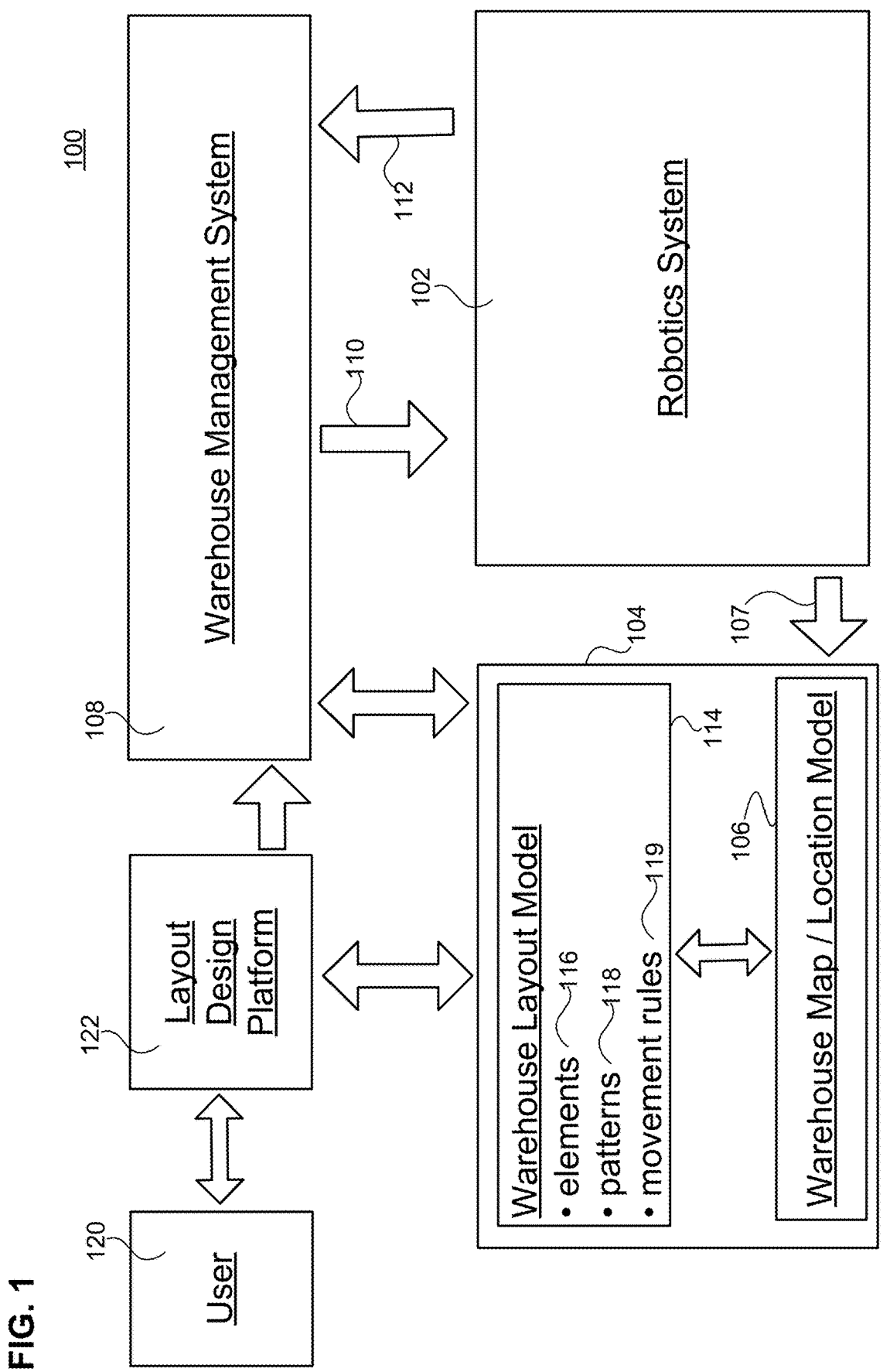
FIG. 1 shows a simplified diagram of a system according to an embodiment.

FIG. 1 shows a simplified view of a system configured to implement resource analysis according to an embodiment. Specifically, system 100 comprises a robotics system 102 that controls the activity of robots in relation to a warehouse model environment 104. In particular, the warehouse map/location model 106 represents a specific physical location of the warehouse, for example using the position of RF sensors. The robotics system interacts with the map/location model 106 via a software program, for example utilizing Quick Response (QR) code 107.

The warehouse management system 108 is designed to interact with the robotic system. For example, the warehouse management system is configured to provide the robotics system with planned tasks 110 requiring movement, such as movement of a product rack to a stationary human stock handler at a workstation. The robotics system is in turn configured to return execution status 112 to the warehouse management system.

According to embodiments, the warehouse model environment further comprises the warehouse layout model 114. The warehouse layout model is configured to provide a basic set of elements 116, patterns 118, and movement rules 119 that are readily configurable across a variety of different possible warehouse physical footprints and robotics systems.

In particular, FIG. 1 shows the human user 120 providing instructions 121 to the warehouse layout model via a layout design platform 122. The platform in turn provides parameters 123 to the layout model to conform it to the needs of the user. As described further below in connection with the example, the layout design platform may include various features allowing:

initial design of the layout model;
management of change of the layout model (e.g., as the warehouse expands); and
deployment and testing of the layout model with the warehouse management system.

Following creation of the layout model, it may be communicated to the warehouse management system for reference in connection with purposes such as stock strategy planning, task planning routing, and execution of the robots of the robotics system.

The layout model is also communicated to a user for display. Based upon review of the warehouse layout model, the user may then provide revised instructions for creating a changed warehouse layout model to reflect updated warehouse conditions (e.g., expansion).

Figure 2:
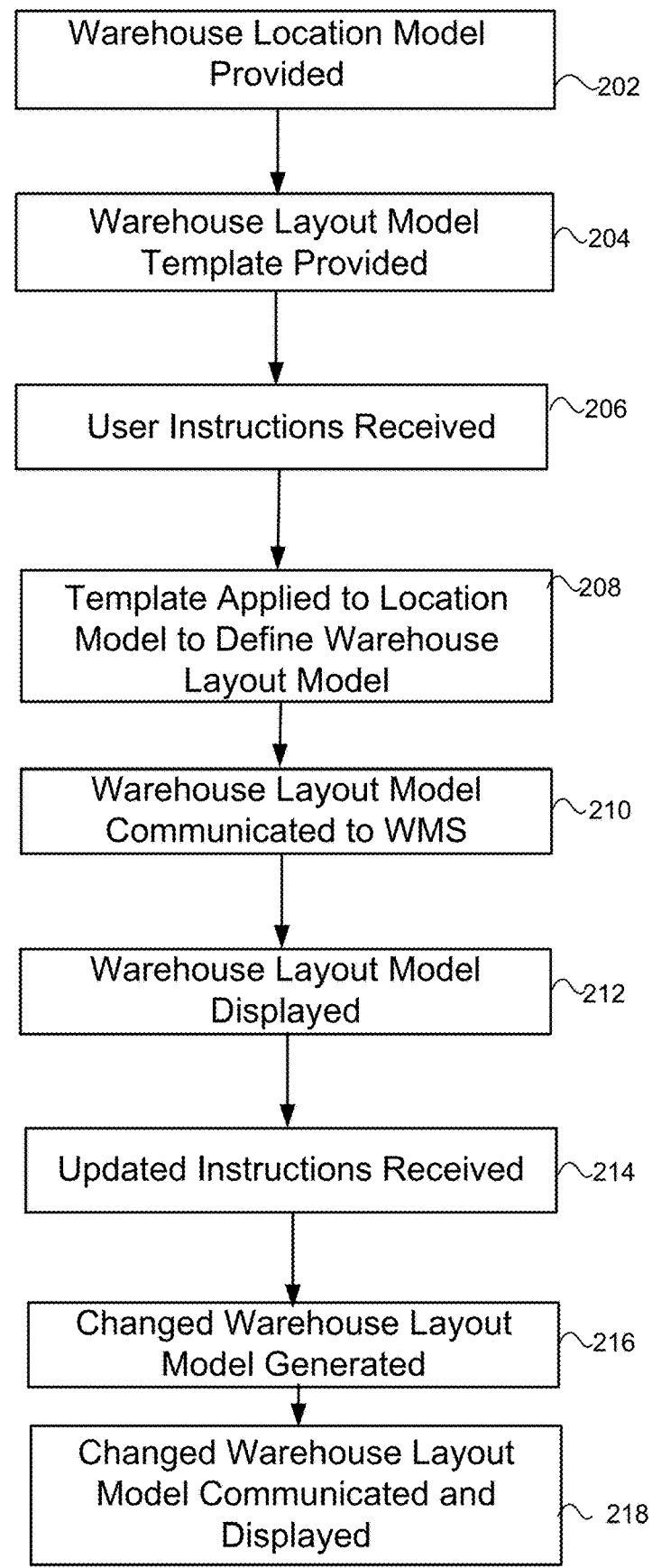
FIG. 2 shows a simplified flow diagram of a method according to an embodiment.

FIG. 2 is a flow diagram showing various actions taken in accordance with an embodiment. At 202 a warehouse location model comprising physical locations of a warehouse recognized by a robotics system (e.g., via QR codes), is provided.

At 204 a warehouse layout model template is provided comprising a plurality of elements, a plurality of patterns assembled from one or more of the plurality of elements, and robot movement rules dictated by one or more of the plurality of patterns.

At 206 instructions are received from a user to generate a warehouse layout model from the physical warehouse model.

At 208 the warehouse layout model template is applied to the physical warehouse model according to the instructions, in order to create the warehouse layout model mapping one or more of the plurality of elements, the plurality of patterns, and the robot movement rules to the physical locations.

At 210, the warehouse layout model is communicated to a warehouse management system. At 212, the warehouse layout model is displayed to a user.

At 214, updated instructions are received from a user to change the warehouse layout model. At 216 the warehouse layout model template is again applied to the physical model to generate a changed warehouse layout model.

At 218 the changed warehouse layout model is communicated to warehouse layout model and to the user for display.

In summary, the warehouse layout model serves as a bridge between the warehouse map/location model specific to a particular physical location and robotics system, and an overlying generalized warehouse management system. The layout model acts as a translator across different robotics systems, facilitating adaptation as a warehouse changes and evolves. The layout model allows the warehouse management system to customize, setup, and deploy for different customers and use cases. Embodiments allow the process of robotics warehouse design to focus upon the space of storage and productivity by number of workstations, with the warehouse management system focusing upon the planning and execution tracking with underlying robotics systems. Use of the warehouse model according to embodiments also offers ready scalability. Based upon the changes in demand for products, it becomes relatively simple to correspondingly adapt warehouse features such as available storage space and numbers of workstations.

Various details of implementing a robotics warehouse layout design according to particular embodiments, are now discussed in connection with the following example of FIGS. 3-4.

Example

Figure 3:
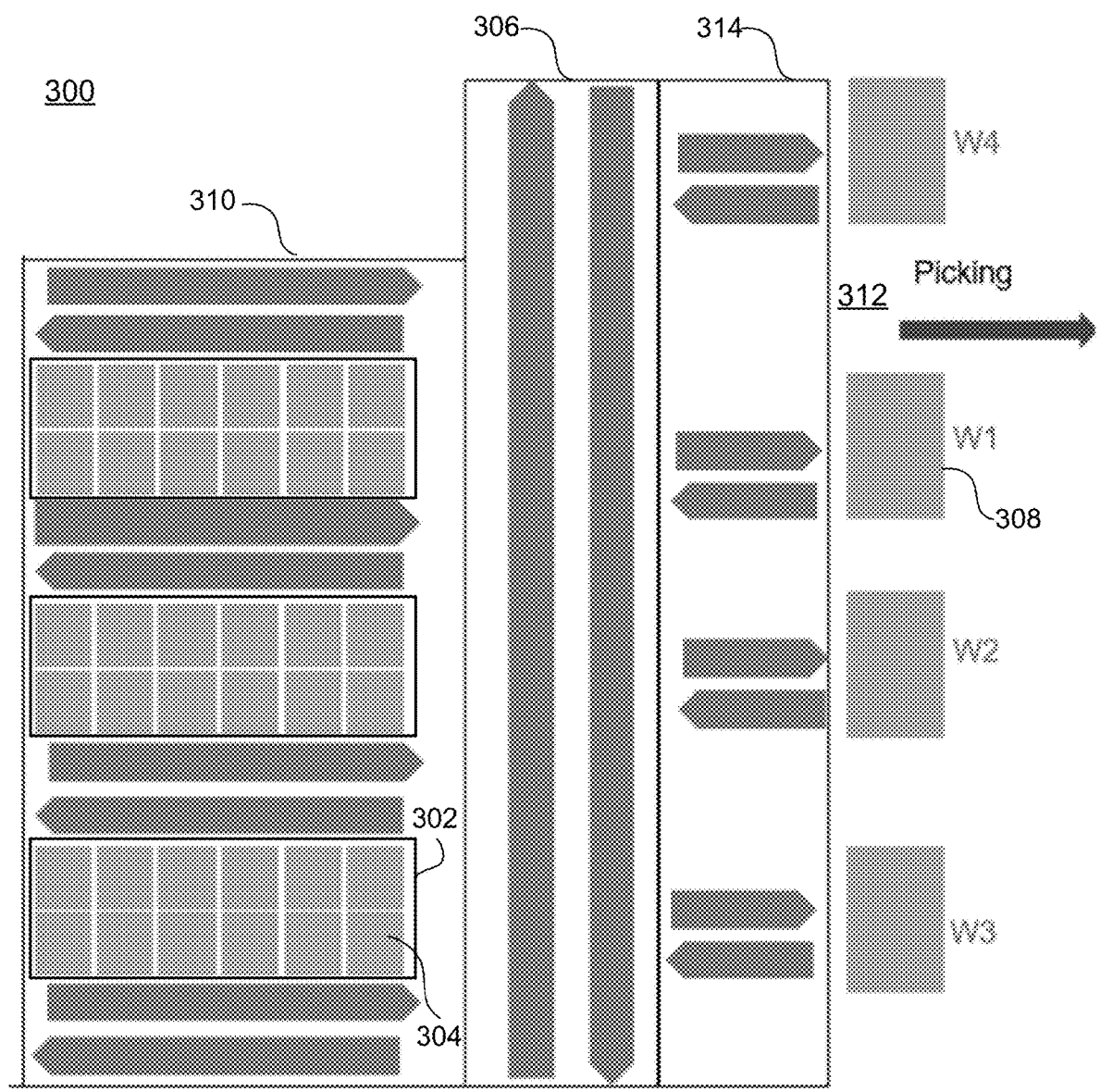
FIG. 3 shows an embodiment of a warehouse layout according to an example.

In particular, FIG. 3 shows an embodiment of a warehouse layout model according to an embodiment. In this example, the layout model 300 may be assembled from a set of basic elements and patterns.

One type of basic layout element is the rackspace block 302 comprising at least one (and typically a plurality of) rackspace(s) 304. A rackspace is the minimum square area for docking a rack which is physically moved by one robot or the docking of the robot itself.

For reasons related to accessibility, a simple rackspace block typically includes two rows of rackspaces. It is noted that the rackspace can also represent the charging area for the (battery-driven) robots.

Another type of basic layout element according to this example, is the bi-directional lane 306. As shown in FIG. 3, such a 2-way lane layout element may be arranged in the horizontal or vertical direction.

Still another type of basic layout element according to this example, is the workstation 308. The workstation marks the stationary location of a human stock handler in the layout, who is interacting with products racks brought to/from her by the robots in order to perform tasks such as picking. Other tasks can include put-away and replenish.

A warehouse layout according to this particular example may comprise a number of different basic patterns. One basic pattern type is the storage area 310.

The storage area pattern includes multiple rackspace blocks. There is at least one lane between adjacent (sibling) rackspace blocks to provide connection between them.

Another basic pattern type is the workstation area 312. This pattern includes one or more workstations. For each workstation area, there is an entry area 314. For each workstation, there are two robot lanes in the entry area providing access to the workstation.

Utilizing the basic elements and patterns just described, a warehouse layout can be modeled based upon specific requirements.

A model driven approach according to embodiments may provide the following basic rules for robot traveling.

A robot can access to the storage for docking on/off the rack.
A robot can access to the workstation for picking/put-away.
A robot shall never collide with another robot.

These basic rules establish a minimum requirement for continuous operation of a robotics warehouse according to this specific example.

Basic robot functions according to this specific example are now described.

A robot may travel in one direction at the lane. A robot travels at a particular speed (S#).
A robot travels in one direction in a specified distance.
A robot can turn right or left 90 degrees.
A robot can wait for any cross road in case it crosses paths with another robot.
A robot can wait for other robot that stops in the route or docks in the workstation.
A robot can dock on/off the rack in the rackspace.

These functions are utilized for the robot to travel and execute the task on the warehouse layout composed of the basic elements and patterns. With two right turns/two left turns, a robot can make a U turn to the opposite lane.

The following is an example of robot ported in one rackspace, navigating to execute a warehouse task with basic robot functions:
1) turn to north, proceed with S1;
2) turn left, proceed with S2;
3) turn left, proceed with S3;
4) carry rack on;
5) turn to north, proceed with S4;
6) turn right, proceed with S5;
7) turn right, proceed with S6;
8) turn left, proceed with S7;
9) turn the side of rack to the workstation;
10) wait until picking/put-away finished.

In addition to the basic layout elements and patterns described above, embodiments may include other, more advanced features. These may call for enhanced functionality of robots and/or WMS systems in order to satisfy basic rules for robot traveling.

One example of an advanced feature is a uni-directional lane. Such a single direction 1-way lane requires more advanced routing planning capability. Moreover, a bi-directional 1-way lane requires more advanced coordination of accessing the robot in the lanes in order to avoid collisions.

Another example of an advanced feature is the lane-on-rackspace. There, a robot (not carrying a rack) can travel on the rackspaces even though there are racks on them. The WMS and/or robotics system may allow planning to travel on such a lane, with a bypass capability permitting the robot to wait under the rack.

Still another example of an advanced feature is the bulk rackspace block. Specifically, a rackspace block comprising more than two rows/columns of rackspaces is a bulk rackspace block. Such a feature requires the robot to access a rackspace which is not immediately adjacent to any lane. This feature calls for the system to have advanced planning of rack placing to allow the removing from this area.

Figure 4:
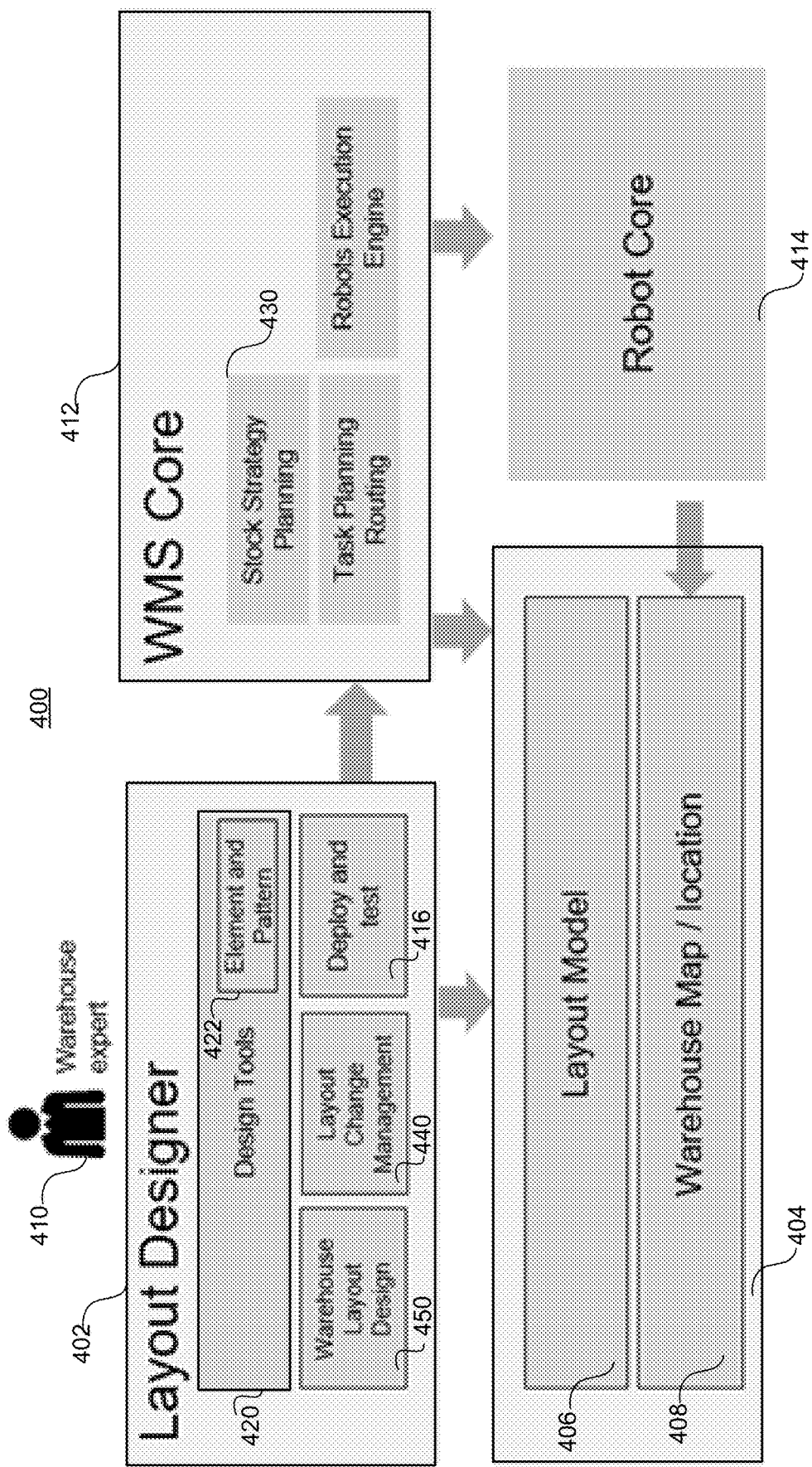
FIG. 4 shows a software solution for a model driven layout design approach according to an example.

FIG. 4 shows a software solution 400 for model driven layout design according to this particular example. Specifically, referencing the basic elements and patterns, the layout design framework 402 can be provided as a design time for creating and changing the warehouse layout model 404. The layout design framework may perform mapping of a layout model component 406 to the underlying map and location technical model 408. In particular, the layout design framework ensures that the basic element and patterns are correctly applied, and that the design resulting from the model can fulfill the basic rules for robot routing and execution.

In FIG. 4 the warehouse expert 410 interacting with the layout design platform, is the individual who can help setup the layout of the warehouse based on business requirements, and ensure the deployment and implementation of the robotics system. Such a warehouse expert has knowledge of the warehouse management system 412 and provides the solution in the context of specific warehouse and business requirements. Typically, however, the warehouse expert is not required to possess detailed knowledge of the robotics system 414 itself.

Deployment of the model to the WMS via module 416, generates corresponding master/customizing content. Examples of such content can include but are not limited to:
storage types;
sections;
activity areas;
workcenters;
bins;
strategy for rackspace determinations;
routing rules; and
others.

While the particular embodiment of FIG. 4 shows the layout design platform as being separate from the WMS, this is not required. According to alternative embodiments the layout design platform can also be part of the WMS.

As shown in FIG. 4, the layout design platform includes design tools 420, one of which is the element and pattern template 422. This element and pattern template includes a number of basic elements and patterns (e.g., those described above) for usage in designing a warehouse layout. The design tool can easily drag and drop in order to compose the elements and patterns into a complete layout. The element and pattern template can also be extended to support more advanced element based on the specific capability of the robot core system and the WMS system.

The layout design platform further includes the warehouse layout design module 450. This module includes the setup of determining the layout and specifically mapping the layout model elements/patterns/rules to the warehouse map/location model.

The warehouse map and location model outlines the warehouse space and areas that a robot can access. Within these areas the map/location model sets the profile for robot location. This step may depend upon the particular underlying robot locating technology. Thus in a QR code-based system for locating robots, the location profile contains all the QR codes design within this warehouse area.

The layout design is based upon the warehouse map and location profile. The layout design uses the element and pattern template to compose the warehouse layout.

The design tool has following functions to facilitate the setup of profile and connecting to the physical warehouse:
exporting and printing of location tag-like QR codes from the profile; and
importing location tag design into the profile by robot traversal tour or directly from a file.

The layout change management module 440 manages the lifecycle of the layout model. Thus when more sales occur, workstation(s) may need to be added and/or rackspaces extended in order to provide more storage. The layout change management module can propose the transition plan to ensure the new layout model is in place for operation. The layout change management module can also perform the check to ensure the model doesn't conflict with basic rules for robot traveling.

As mentioned above, the layout design platform further includes deploy and test module 416. The design tool can activate the design model to deploy into the WMS system. For example, such deployment can ensure that the stock strategy planning 430 of the WMS is consistent with the layout design of the model. Here, the stock planning strategy plans the stock based upon the locations of the racks.

Other components of the WMS core shown in FIG. 4 include task planning and routing which plan the route travel based on the warehouse layout and map. The robots execution engine plans the robot actions, communicates with the robots, and performs execution tracking.

According to this example, the testing may mainly be for verification of the implementation for warehouse map and location profile, as well as the layout design.

The deploy and testing module generates the tasks for robots full traversal routing within the warehouse to verify the location tag/QR code.

The deploy and testing module generates the tasks for robots to dock all the racks into rackspaces for storage to verify the identification of the rack and rackspaces holding capability of racks.

The deploy and testing module generates the tasks for robots to carry to rack and traversal on the lanes to verify the pass capability of physical layout.

The deploy and testing module generates the tasks for charging to ensure the reachability of charging area.

For a newly created warehouse, full testing scope may be required. For a implementation in a changed warehouse design, only a delta part may need to be tested.

Figure 5:
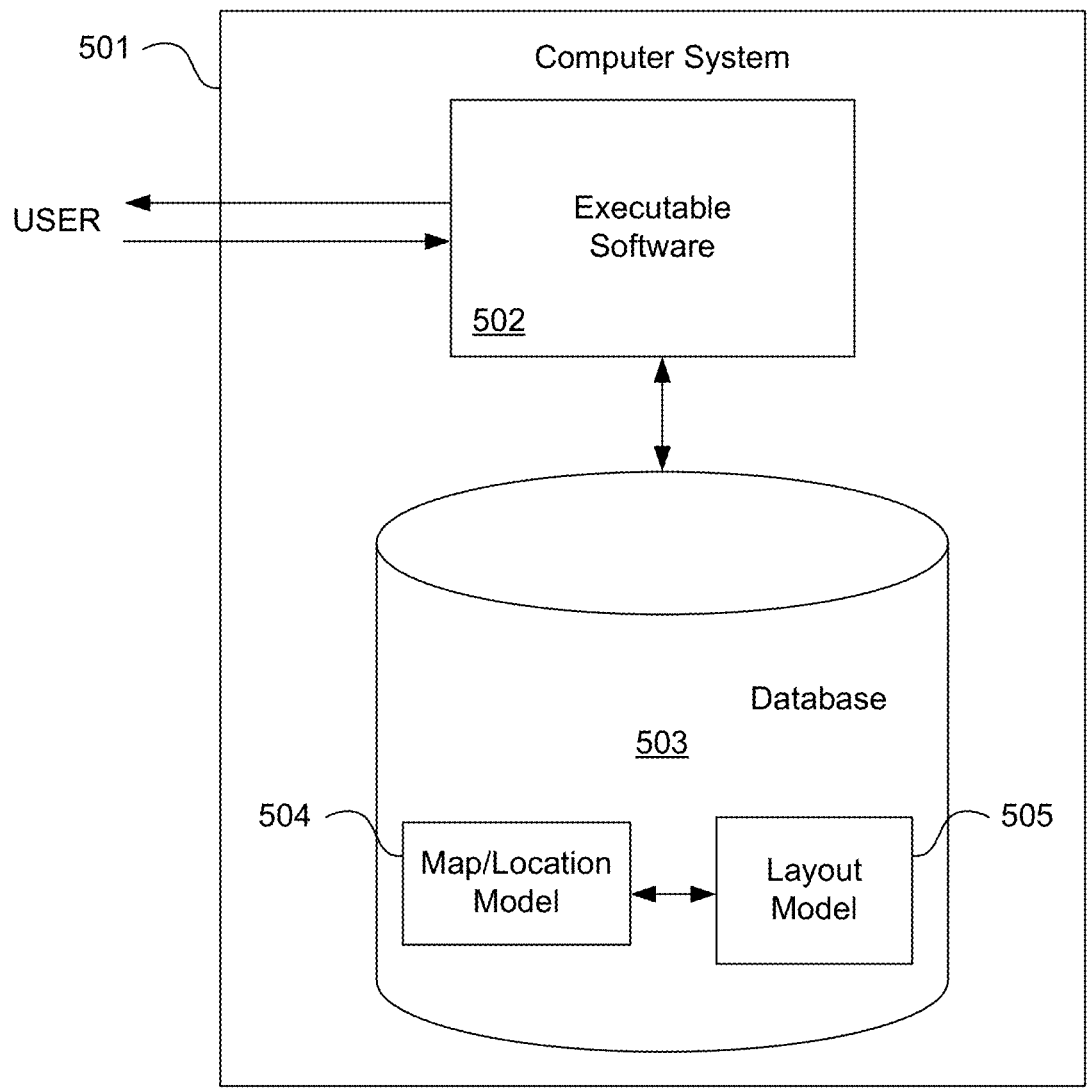
FIG. 5 illustrates hardware of a special purpose computing machine according to an embodiment that is configured to perform robotics warehouse layout design.

Certain embodiments may be implemented in connection with an in-memory database, with the in-memory database engine performing one or more of the roles of the design platform and/or models. Accordingly, FIG. 5 illustrates hardware of a special purpose computing machine configured to implement robotics warehouse layout according to an embodiment. In particular, computer system 501 comprises a processor 502 that is in electronic communication with a non-transitory computer-readable storage medium comprising a database 503. This computer-readable storage medium has stored thereon code 505 corresponding to a layout model. Code 504 corresponds to a map/location model. Code may be configured to reference data stored in a database of a non-transitory computer-readable storage medium, for example as may be present locally or in a remote database server. Software servers together may form a cluster or logical network of computer systems programmed with software programs that communicate with each other and work together in order to process requests.

Figure 6:
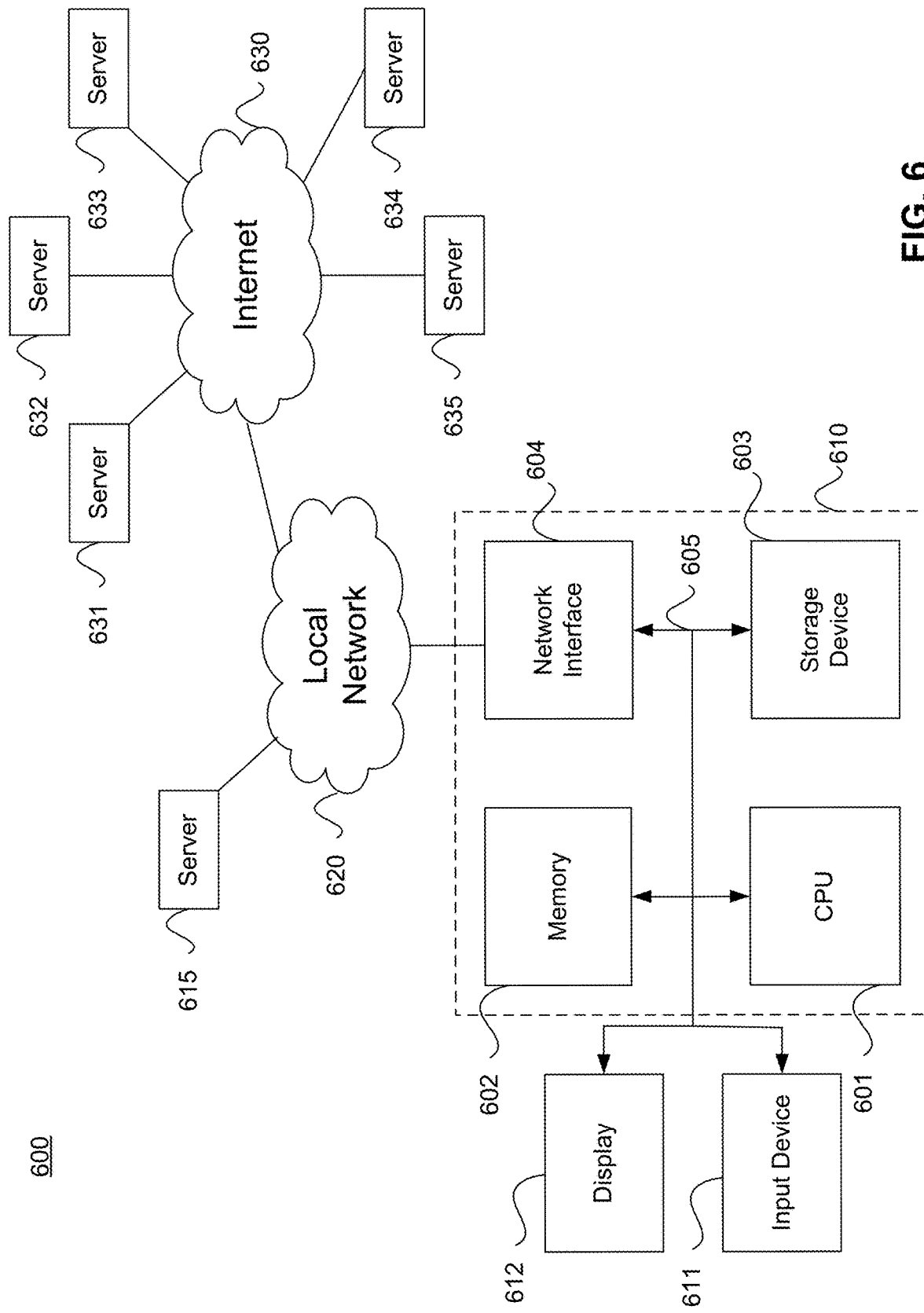
FIG. 6 illustrates an example computer system.

An example computer system 600 is illustrated in FIG. 6. Computer system 610 includes a bus 605 or other communication mechanism for communicating information, and a processor 601 coupled with bus 605 for processing information. Computer system 610 also includes a memory 602 coupled to bus 605 for storing information and instructions to be executed by processor 601, including information and instructions for performing the techniques described above, for example. This memory may also be used for storing variables or other intermediate information during execution of instructions to be executed by processor 601. Possible implementations of this memory may be, but are not limited to, random access memory (RAM), read only memory (ROM), or both. A storage device 603 is also provided for storing information and instructions. Common forms of storage devices include, for example, a hard drive, a magnetic disk, an optical disk, a CD-ROM, a DVD, a flash memory, a USB memory card, or any other medium from which a computer can read. Storage device 603 may include source code, binary code, or software files for performing the techniques above, for example. Storage device and memory are both examples of computer readable mediums.

Computer system 610 may be coupled via bus 605 to a display 612, such as a cathode ray tube (CRT) or liquid crystal display (LCD), for displaying information to a computer user. An input device 611 such as a keyboard and/or mouse is coupled to bus 605 for communicating information and command selections from the user to processor 601. The combination of these components allows the user to communicate with the system. In some systems, bus 605 may be divided into multiple specialized buses.

Computer system 610 also includes a network interface 604 coupled with bus 605. Network interface 604 may provide two-way data communication between computer system 610 and the local network 620. The network interface 604 may be a digital subscriber line (DSL) or a modem to provide data communication connection over a telephone line, for example. Another example of the network interface is a local area network (LAN) card to provide a data communication connection to a compatible LAN. Wireless links are another example. In any such implementation, network interface 604 sends and receives electrical, electromagnetic, or optical signals that carry digital data streams representing various types of information.

Computer system 610 can send and receive information, including messages or other interface actions, through the network interface 604 across a local network 620, an Intranet, or the Internet 630. For a local network, computer system 610 may communicate with a plurality of other computer machines, such as server 615. Accordingly, computer system 610 and server computer systems represented by server 615 may form a cloud computing network, which may be programmed with processes described herein. In the Internet example, software components or services may reside on multiple different computer systems 610 or servers 631-635 across the network. The processes described above may be implemented on one or more servers, for example. A server 631 may transmit actions or messages from one component, through Internet 630, local network 620, and network interface 604 to a component on computer system 610. The software components and processes described above may be implemented on any computer system and send and/or receive information across a network, for example.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A computer-implemented method comprising:
   an in-memory database engine of an in-memory database receiving instructions from a layout change management module to create a warehouse layout model from a warehouse location model comprising physical locations of a plurality of elements of a warehouse recognized by a robotics system;
   the in-memory database engine creating the warehouse layout model according to the instructions by applying the warehouse location model stored in the in-memory database to a warehouse layout model template stored in the in-memory database and comprising,
      the plurality of elements including a stationary workstation,
      a plurality of patterns assembled using an element and pattern template from one or more of the plurality of elements, and
      robot movement rules dictated by one or more of the plurality of patterns, wherein the creating comprises the warehouse layout model mapping one or more of the plurality of elements, the plurality of patterns, the robot movement rules, and the stationary workstation to the physical locations of the warehouse location model;
   the in-memory database engine communicating the warehouse layout model for display;
   the in-memory database engine receiving updated instructions including a transition plan to manage a lifecycle of the warehouse layout model;
   applying the warehouse layout model template to the warehouse location model to generate a changed warehouse layout model including an added stationary workstation; and
   communicating the changed warehouse layout model for display.

2. The method as in claim 1 wherein the creating comprises mapping, by the warehouse layout model, one of the plurality of elements comprising a product rackspace, to the physical locations.

3. The method as in claim 2 wherein the creating comprises mapping, by the warehouse layout model, one of the plurality of patterns comprising a storage area including a plurality of blocks of product rackspaces, to the physical locations.

4. The method as in claim 1 wherein the creating comprises mapping, by the warehouse layout model, one of the plurality of elements comprising a robot movement lane, to the physical locations.

5. The method as in claim 4 wherein the robot movement lane is bi-directional.

6. The method as in claim 1 wherein the creating comprises mapping, by the warehouse layout model, one of the plurality of patterns comprising a workstation area including an entry area, to the physical locations.

7. The method as in claim 1 wherein the creating comprises mapping, by the warehouse layout model, to the physical locations comprising quick response (QR) codes.

8. The method as in claim 1 wherein the robot movement rules preclude a robot from occupying a same element at a same time as another robot.

9. A non-transitory computer readable storage medium embodying a computer program for performing a method, said method comprising:

an in-memory database engine of an in-memory database receiving instructions from a layout change management module to create a warehouse layout model from a warehouse location model comprising physical locations of a plurality of elements of a warehouse recognized by a robotics system;

the in-memory database engine creating the warehouse layout model according to the instructions by applying the warehouse location model stored in the in-memory database to a warehouse layout model template stored in the in-memory database and comprising, the plurality of elements including a product rackspace, a robot movement lane, and a stationary workstation, a plurality of patterns assembled using an element and pattern template from one or more of the plurality of elements, and robot movement rules dictated by one or more of the plurality of patterns, wherein the creating comprises the warehouse layout model mapping one or more of the plurality of elements, the plurality of patterns, the robot movement rules, and the stationary workstation to the physical locations of the warehouse location model;

the in-memory database engine communicating the warehouse layout model for display;

the in-memory database engine receiving updated instructions including a transition plan to manage a lifecycle of the warehouse layout model;

applying the warehouse layout model template to the warehouse location model to generate a changed warehouse layout model including an added stationary workstation; and communicating the changed warehouse layout model for display.

10. The non-transitory computer readable storage medium as in claim 9 wherein the creating comprises mapping, by the warehouse layout model, to the physical locations comprising quick response (QR) codes.

11. The non-transitory computer readable storage medium as in claim 9 further comprising communicating the warehouse layout model to a warehouse management system to operate the robotics system.

12. The non-transitory computer readable storage medium as in claim 9 wherein one of the plurality of patterns comprises a workspace area including an entry area.

13. A computer system comprising:

one or more processors;

a software program, executable on said computer system, the software program configured to cause an in-memory database engine of an in-memory database to:

access a warehouse location model stored in the in-memory database and comprising physical locations of a plurality of elements of a warehouse recognized by a robotics system;

access a warehouse layout model template stored in the in-memory database and comprising, the plurality of elements including a stationary workstation, a plurality of patterns assembled using an element and pattern template from one or more of the plurality of elements, and robot movement rules dictated by one or more of the plurality of patterns;

receive instructions from a layout change management module to generate a warehouse layout model from the physical warehouse model;

apply the warehouse layout model template to the physical warehouse model according to the instructions to create the warehouse layout model mapping one or more of the plurality of elements, the plurality of patterns, the robot movement rules, and the stationary workstation to the physical locations of the warehouse location model;

communicate the warehouse layout model for display;

the in-memory database engine receiving updated instructions including a transition plan to manage a lifecycle of the warehouse layout model;

applying the warehouse layout model template to the warehouse location model to generate a changed warehouse layout model including an added stationary workstation; and communicating the changed warehouse layout model for display.

14. The computer system as in claim 13 wherein the plurality of elements further comprise product rackspaces and robot movement lanes.

15. The computer system as in claim 13 wherein the physical locations comprise quick response (QR) codes.

16. The computer system as in claim 13 wherein the robot movement rules preclude a robot from occupying a same element at a same time as another robot.

* * * * *